United States Patent
Chhajed et al.

(10) Patent No.: US 12,150,312 B2
(45) Date of Patent: Nov. 19, 2024

(54) ARRAY OF CAPACITORS, ARRAY OF MEMORY CELLS, METHODS OF FORMING AN ARRAY OF CAPACITORS, AND METHODS OF FORMING AN ARRAY OF MEMORY CELLS

(71) Applicant: Micron Technology, Inc., Boise, ID (US)

(72) Inventors: Sameer Chhajed, Boise, ID (US); Ashonita A. Chavan, Boise, ID (US); Mark Fischer, Meridian, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 417 days.

(21) Appl. No.: 17/567,268

(22) Filed: Jan. 3, 2022

(65) Prior Publication Data
US 2022/0130845 A1 Apr. 28, 2022

Related U.S. Application Data

(62) Division of application No. 16/225,814, filed on Dec. 19, 2018, now Pat. No. 11,244,952.

(51) Int. Cl.
*H10B 53/30* (2023.01)
*H01L 29/66* (2006.01)
(Continued)

(52) U.S. Cl.
CPC ............. *H10B 53/30* (2023.02); *H01L 28/60* (2013.01); *H01L 28/91* (2013.01);
(Continued)

(58) Field of Classification Search
CPC ......... H01L 27/11507; H01L 27/10811; H01L 27/10823; H01L 27/10841;
(Continued)

(56) References Cited

U.S. PATENT DOCUMENTS

| 9,761,580 | B1* | 9/2017 | Ramaswamy | ........ G11C 11/401 |
| 2008/0283816 | A1* | 11/2008 | Takaishi | .................. H10B 63/00 |
| | | | | 257/E47.001 |

(Continued)

OTHER PUBLICATIONS

WO PCT/US2019/063306 IPRP, Jun. 16, 2021, Micron Technology, Inc.

(Continued)

*Primary Examiner* — Tuan A Hoang
(74) *Attorney, Agent, or Firm* — Wells St. John P.S.

(57) ABSTRACT

A method of forming an array of capacitors comprises forming a plurality of horizontally-spaced groups that individually comprise a plurality of horizontally-spaced lower capacitor electrodes having a capacitor insulator thereover. Adjacent of the groups are horizontally spaced farther apart than are adjacent of the lower capacitor electrodes within the groups. A void space is between the adjacent groups. An upper capacitor electrode material is formed in the void space and in the groups over the capacitor insulator and the lower capacitor electrodes. The upper capacitor electrode material in the void space connects the upper capacitor electrode material that is in the adjacent groups relative to one another. The upper capacitor electrode material less-than-fills the void space. At least a portion of the upper capacitor electrode material is removed from the void space to disconnect the upper capacitor electrode material in the adjacent groups from being connected relative to one another. A horizontally-elongated conductive line is formed atop and is directly electrically coupled to the upper capaci- (Continued)

tor electrode material in individual of the groups. Other methods, including structure independent of method of manufacture, are disclosed.

20 Claims, 15 Drawing Sheets

(51) Int. Cl.
  *H01L 29/78* (2006.01)
  *H01L 49/02* (2006.01)
  *H10B 12/00* (2023.01)
  *H10B 53/10* (2023.01)

(52) U.S. Cl.
  CPC .... *H01L 29/66666* (2013.01); *H01L 29/7827* (2013.01); *H10B 12/033* (2023.02); *H10B 12/053* (2023.02); *H10B 12/312* (2023.02); *H10B 12/34* (2023.02); *H10B 12/395* (2023.02); *H10B 53/10* (2023.02)

(58) Field of Classification Search
  CPC ......... H01L 27/10852; H01L 27/10876; H01L 29/66666; H01L 29/7827; H10B 12/312; H10B 12/30; H10B 12/395; H10B 12/033; H10B 12/053
  See application file for complete search history.

(56) References Cited

U.S. PATENT DOCUMENTS

| | | |
|---|---|---|
| 2009/0068814 A1 | 3/2009 | Cho et al. |
| 2018/0122816 A1 | 5/2018 | Ramaswamy |
| 2018/0269283 A1 | 9/2018 | Ramaswamy |
| 2018/0315658 A1 | 11/2018 | Ramaswamy |
| 2018/0358428 A1 | 12/2018 | Park et al. |
| 2019/0189357 A1 | 6/2019 | Chavan et al. |

OTHER PUBLICATIONS

WO PCT/US2019/063306 Search Rept, Mar. 20, 2020, Micron Technology, Inc.
WO PCT/US2019/063306 Written Opin, Mar. 20, 2020, Micron Technology, Inc.

\* cited by examiner

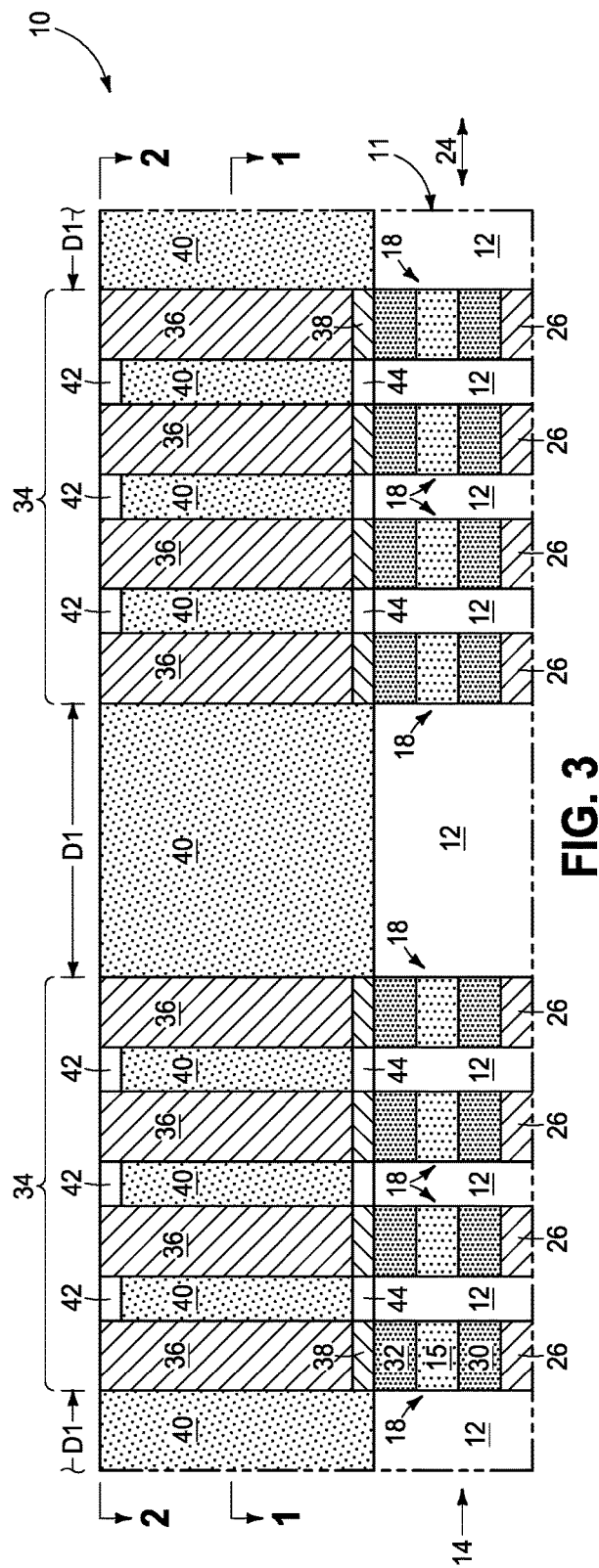
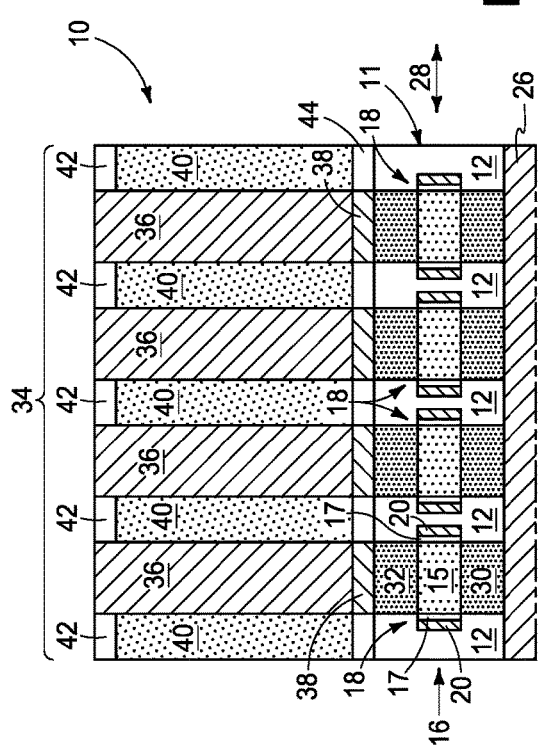
FIG. 3
FIG. 4

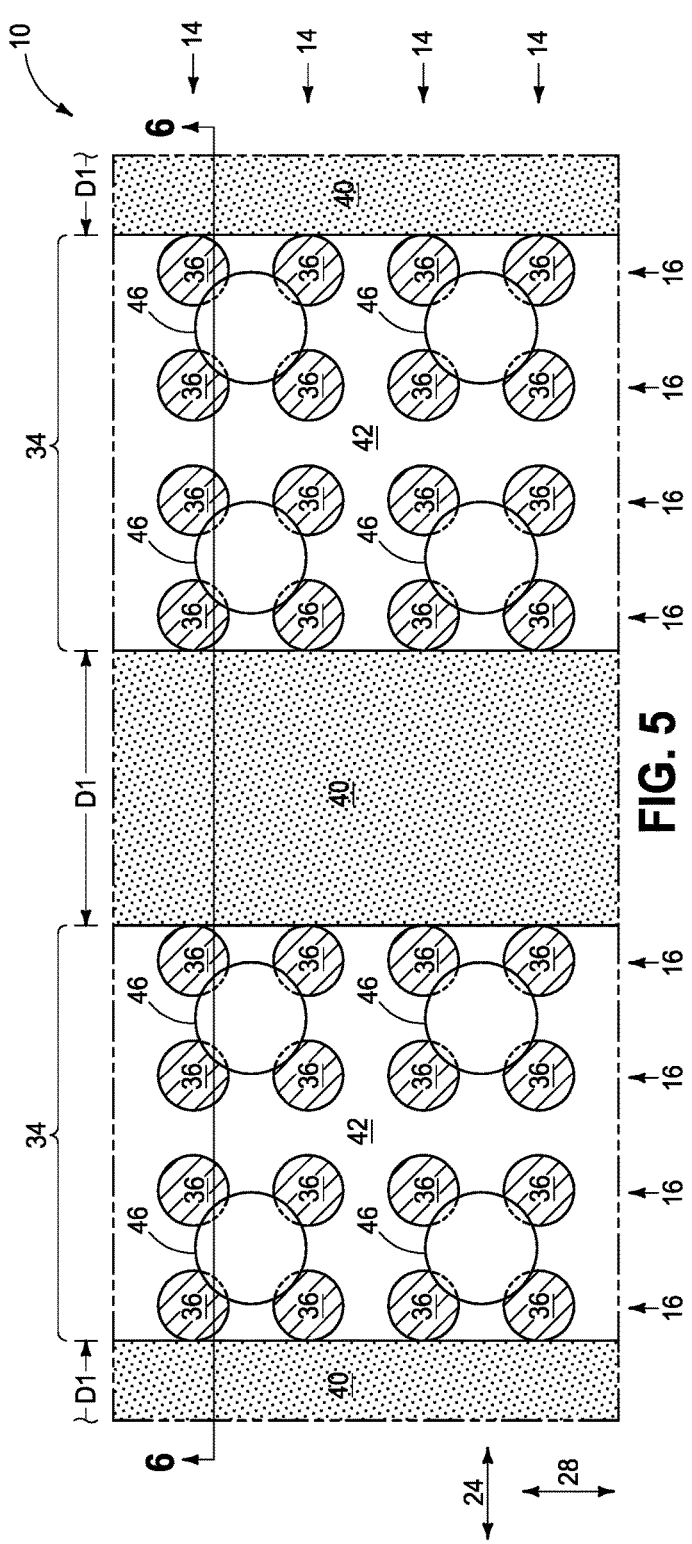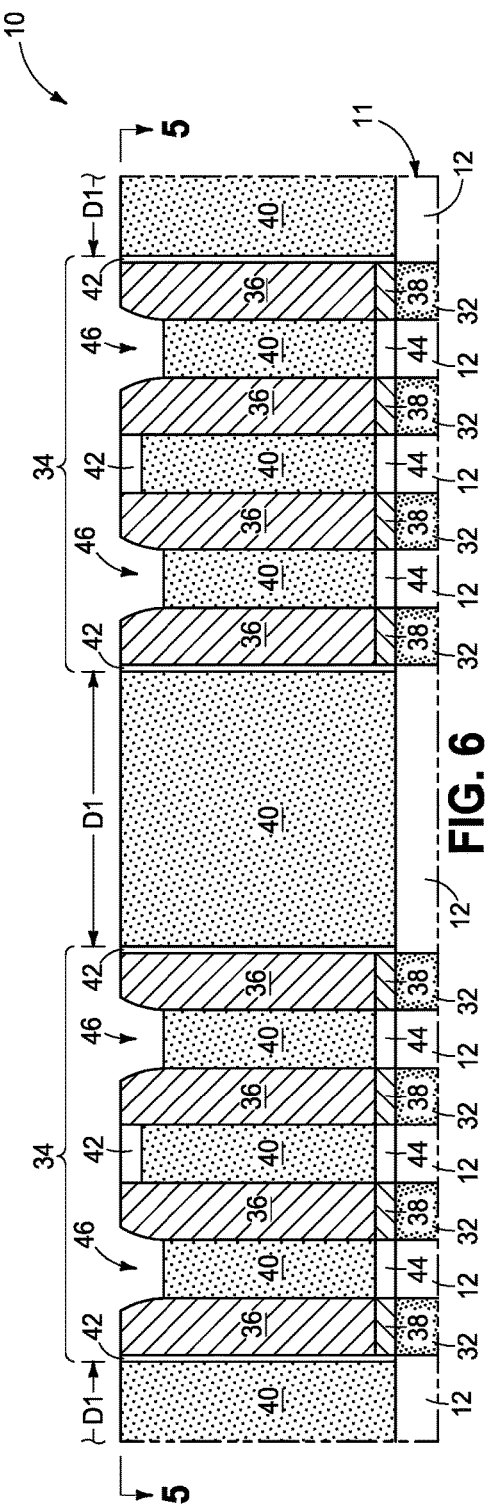

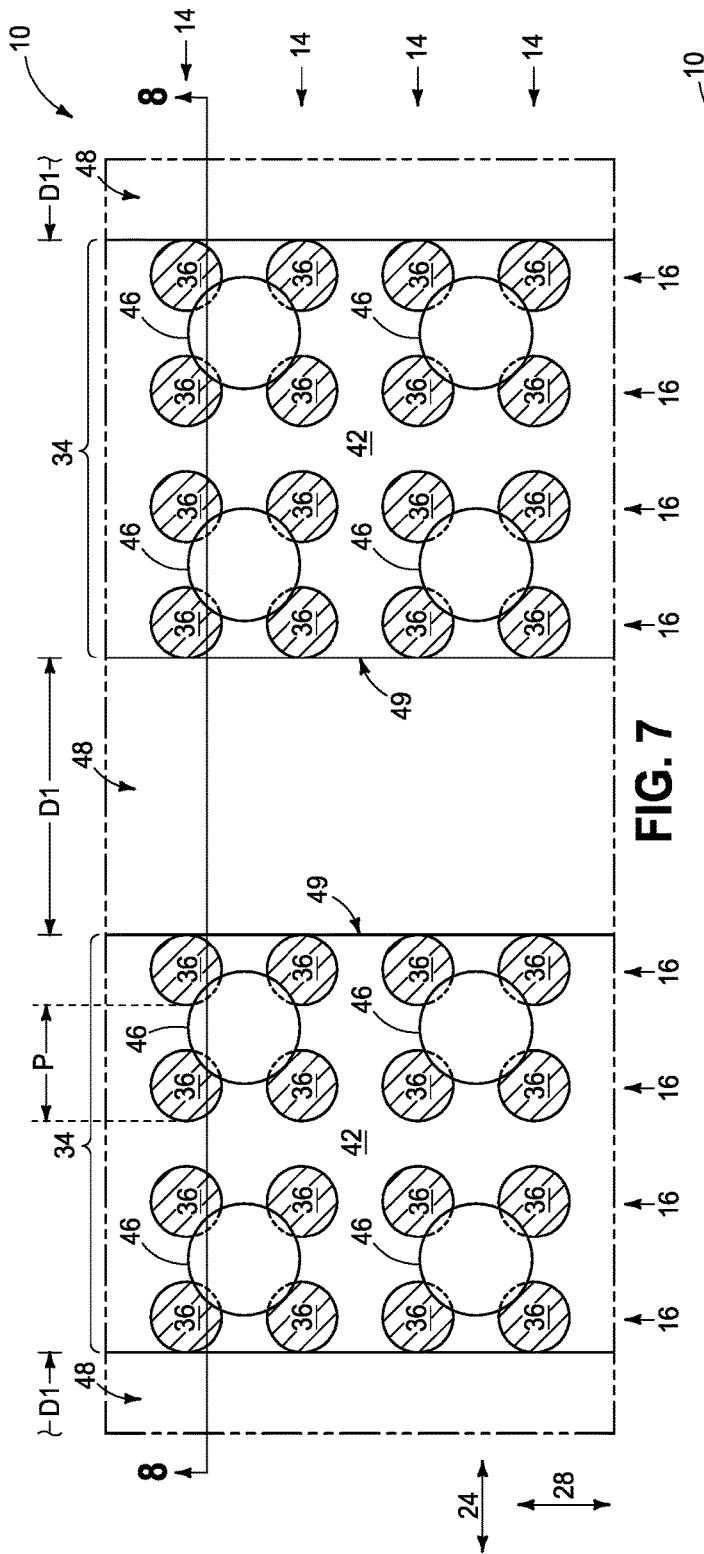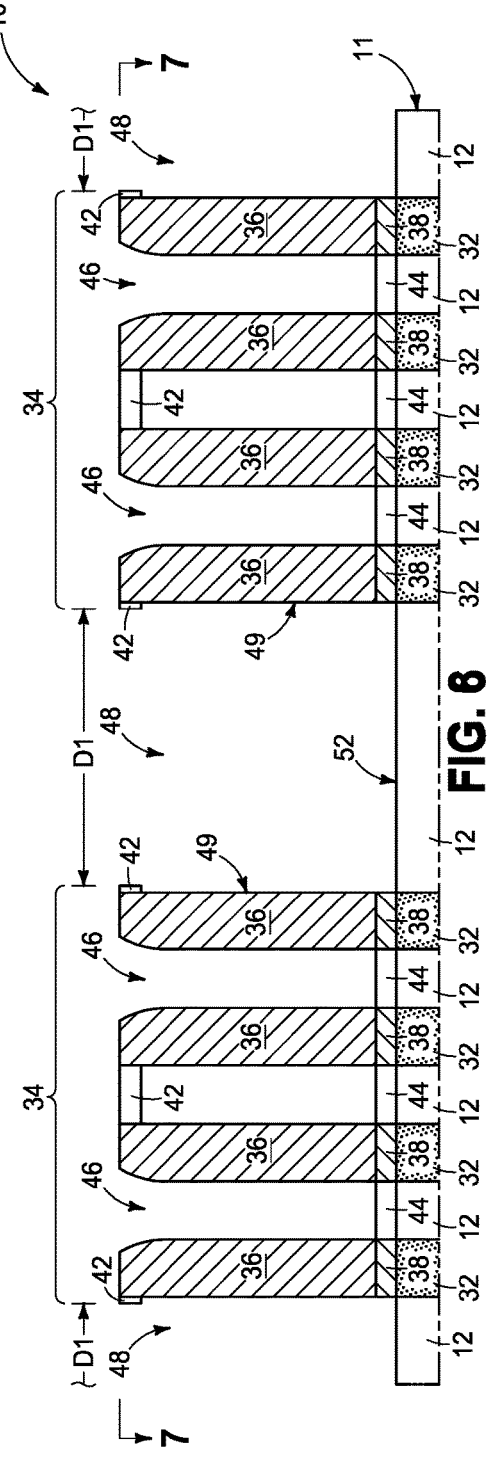

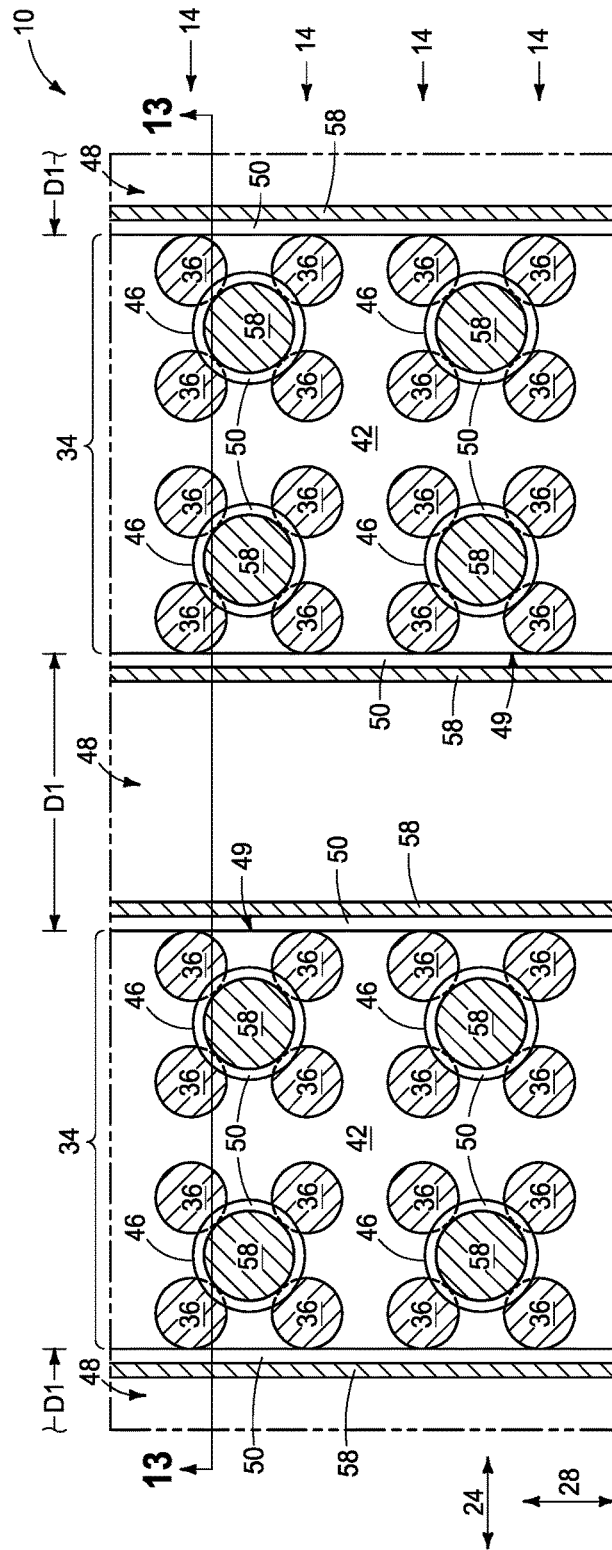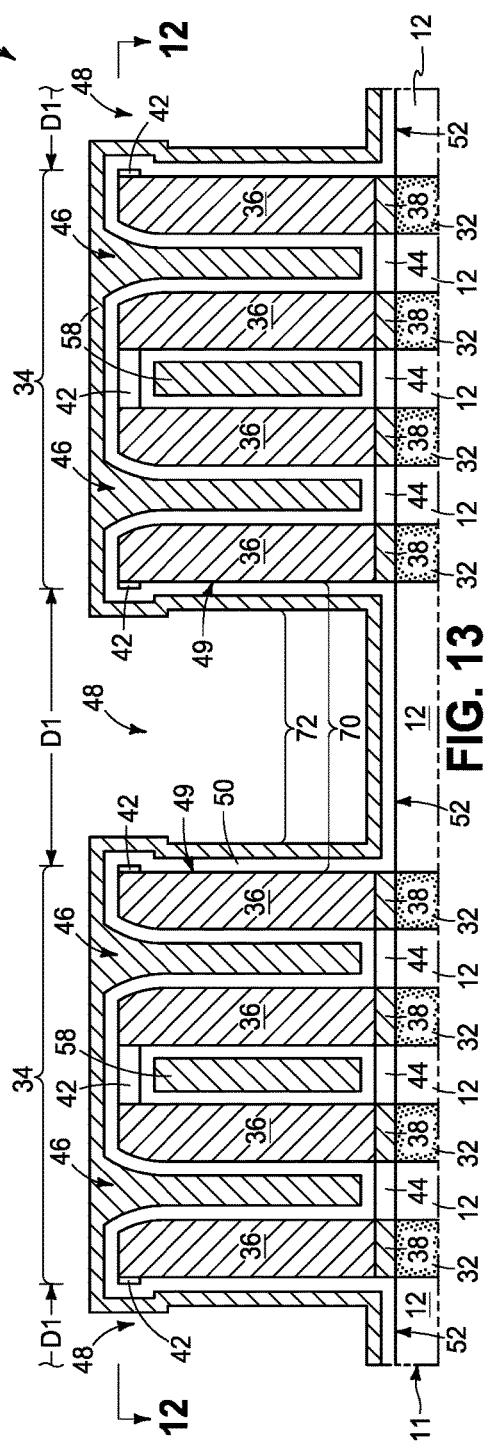
FIG. 12
FIG. 13

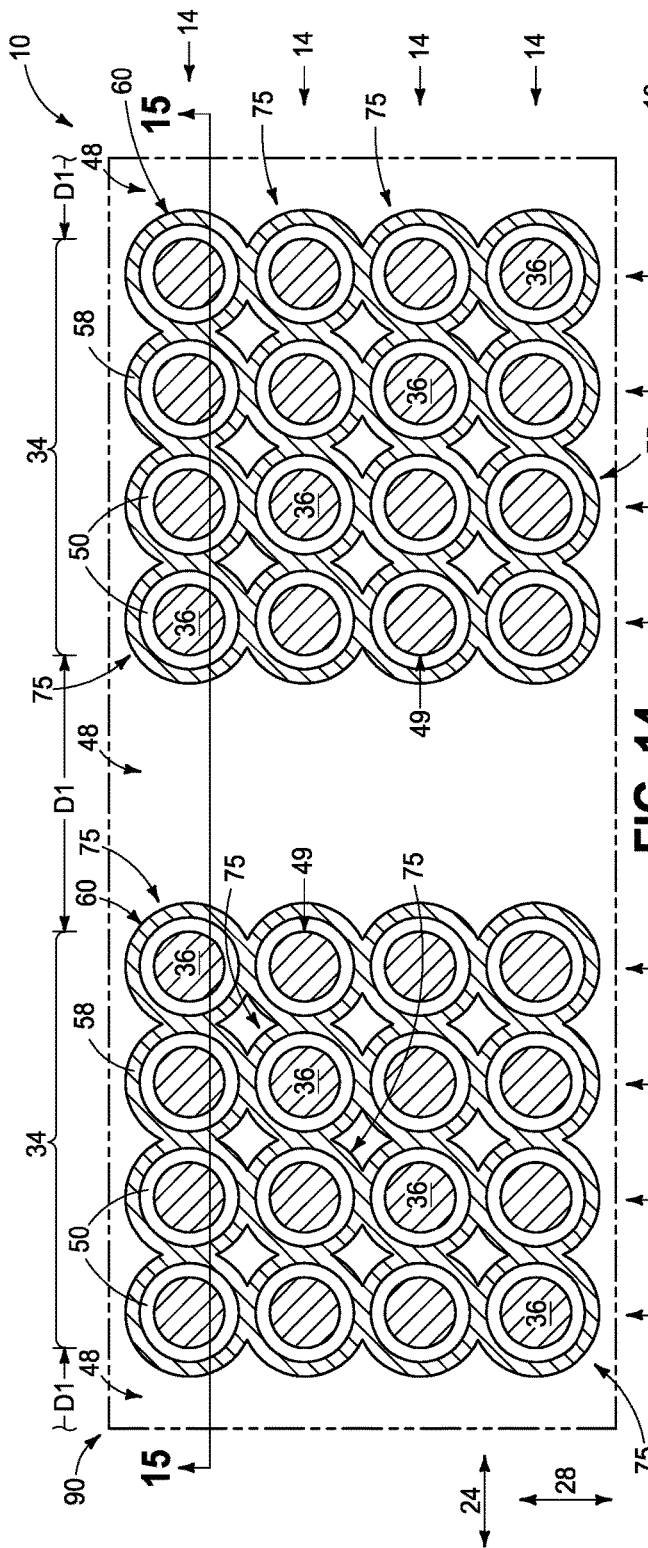
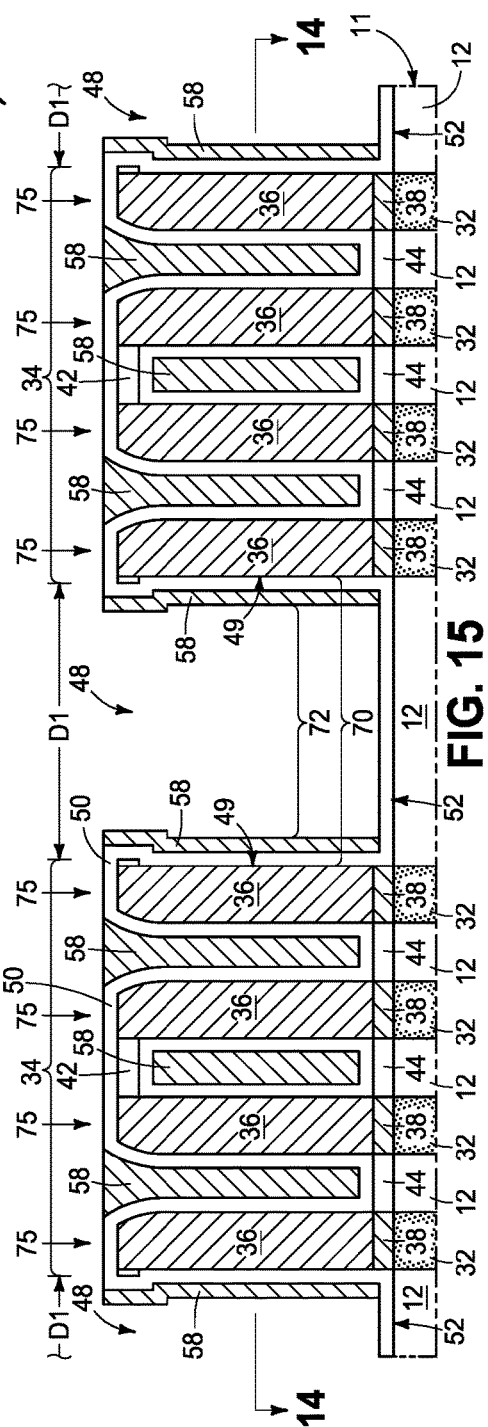
FIG. 14
FIG. 15

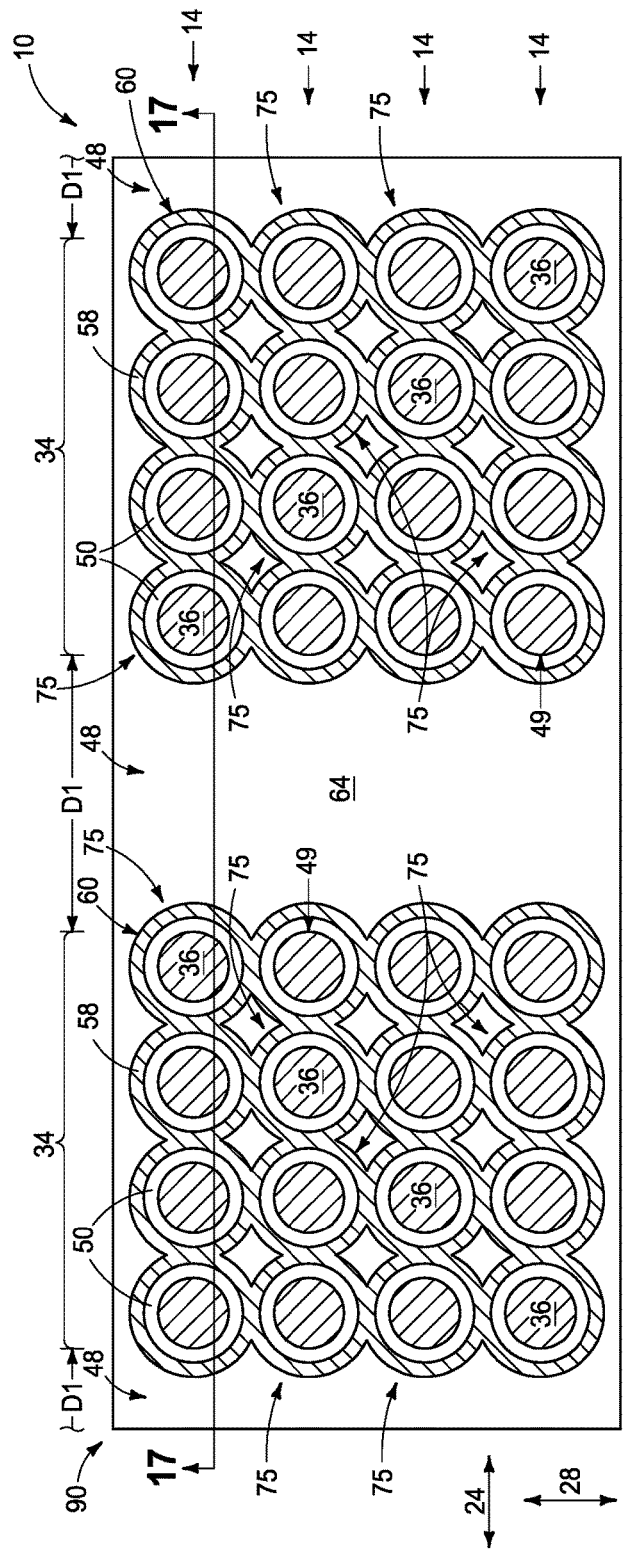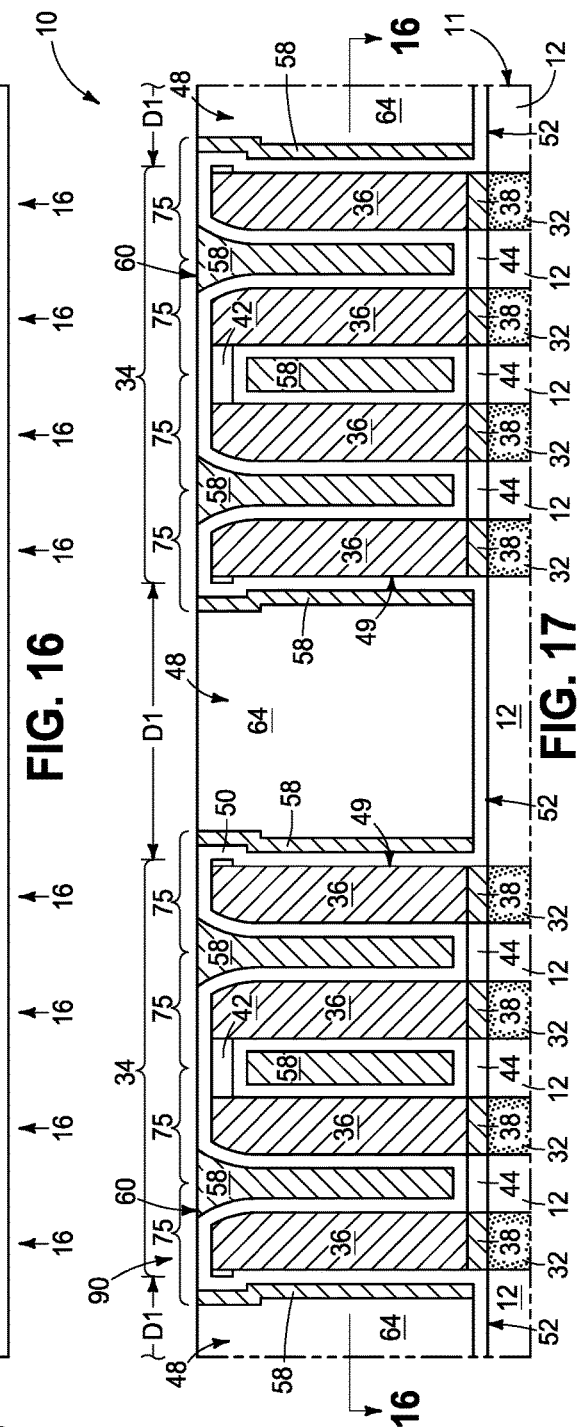

ARRAY OF CAPACITORS, ARRAY OF MEMORY CELLS, METHODS OF FORMING AN ARRAY OF CAPACITORS, AND METHODS OF FORMING AN ARRAY OF MEMORY CELLS

RELATED PATENT DATA

This patent resulted from a divisional application of Serial U.S. patent application Ser. No. 16/225,814, filed Dec. 19, 2018, entitled "Array Of Capacitors, Array Of Memory Cells, Methods Of Forming An Array Of Capacitors, And Methods Of Forming An Array Of Memory Cells", naming Sameer Chhajed, Ashonita A. Chavan, Mark Fischer, and Durai Vishak Nirmal Ramaswamy as inventors, the disclosure of which is incorporated by reference.

TECHNICAL FIELD

Embodiments disclosed herein pertain to arrays of capacitors, to arrays of memory cells, to methods of forming an array of capacitors, and to methods of forming an array of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the hi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

BRIEF DESCRIPTION OF THE DRAWINGS

FIG. 3 is a view taken through line 3-3 in FIGS. 1 and 2.

FIG. 4 is a view taken through line 4-4 in FIGS. 1 and 2.

FIG. 5 is a partial view of the FIG. 1 construction at a processing step subsequent to that shown by FIG. 1 and is taken through line 5-5 in FIG. 6.

FIG. 6 is a view taken through line 6-6 in FIG. 5.

FIG. 7 is a view of the FIG. 5 construction at a processing step subsequent to that shown by FIG. 5 and is taken through line 7-7 in FIG. 8.

FIG. 8 is a view taken through line 8-8 in FIG. 7.

FIG. 12 is a view of the FIG. 9 construction at a processing step subsequent to that shown by FIG. 9 and is taken through line 12-12 in FIG. 13, FIG. 13 is a view taken through line 13-13 in FIG. 12.

FIG. 14 is a view of the FIG. 12 construction at a processing step subsequent to that shown by FIG. 12 and is taken through line 14-14 in FIG. 15, FIG. 15 is a view taken through line 15-15 in FIG. 14.

FIG. 16 is a view of the FIG. 14 construction at a processing step subsequent to that shown by FIG. 14 and is taken through line 16-16 in FIG. 17.

FIG. 17 is a view taken through line 17-17 in FIG. 16.

DETAILED DESCRIPTION OF EXAMPLE EMBODIMENTS

Figure 1:
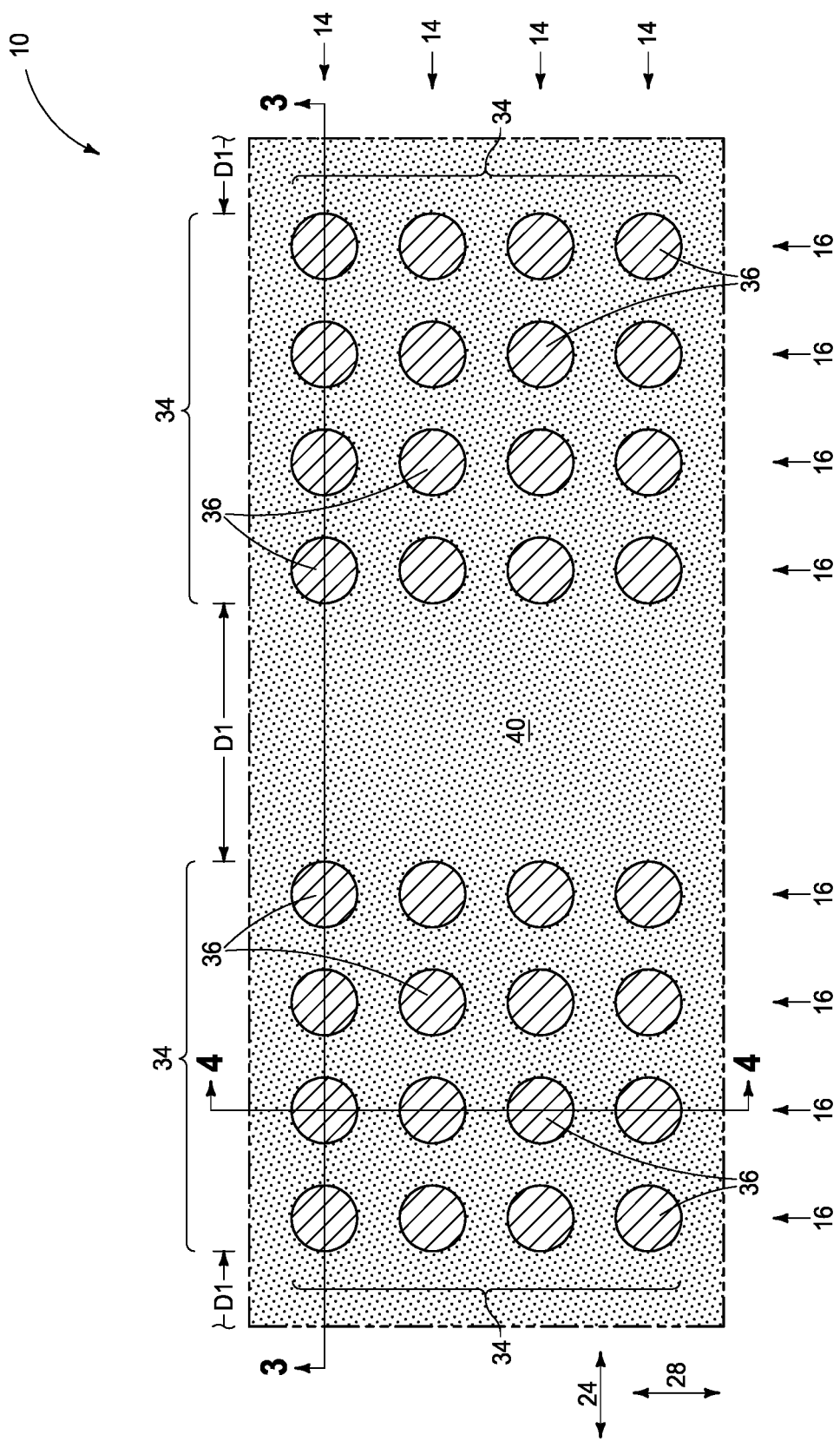
FIG. 1 is a diagrammatic cross-sectional view of a portion of a construction in process in accordance with some embodiments of the invention and is taken through line 1-1 in FIG. 3.

Embodiments of the invention encompass arrays of capacitors, arrays of memory cells, methods of forming an array of capacitors, and methods of forming an array of memory cells. Example method embodiments are initially described with reference to FIGS. 1-22.

Referring to FIGS. 1-4, such show a portion of a substrate construction 10 comprising a base substrate 11 comprising any one or more of conductive/conductor/conducting, semiconductive/semiconductor/semiconducting, and insulative/insulator insulating (i.e., electrically herein) materials. Various materials have been formed elevationally over and within base substrate 11. Materials may be aside, elevationally inward, or elevationally outward of the FIGS. 1-4-depicted materials. For example, other partially or wholly fabricated components of integrated circuitry may be provided somewhere above, about, or within base substrate 11. Control and/or other peripheral circuitry for operating components within an array of capacitors and/or memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Rows 14 and columns 16 of transistors 18, which in one embodiment are vertical transistors, have been formed relative to or within substrate 11. An access line 20 (FIG. 4) interconnects multiple of transistors 18 along individual rows 14 in a row direction 24. In the example embodiment, access lines 20 are individually shown formed as a pair of lines running on opposite sides of a channel region 15 of individual transistors 18, with a gate insulator 17 being between channel regions 15 and conductive material of access lines 20. Transistors 18 individually comprise a lower source/drain region 30 and an upper source/drain region 32. A digitline 26 interconnects multiple transistors 18 along individual columns 16 in a column direction 28, Individual lower source/drain regions 30 are directly electrically coupled with individual digitlines 26. Dielectric material 12 (e.g., silicon dioxide and/or silicon nitride) is shown surrounding transistors 18 and digitlines 26.

A plurality of horizontally-spaced groups 34 individually comprising a plurality of horizontally-spaced lower capacitor electrodes 36 has been formed above base substrate 11, Individual lower capacitor electrodes 36 in one embodiment are directly above and directly electrically coupled to individual upper source/drain regions 32 of individual transistors 18. An example conductive material 38 (e.g., metal material) of different composition from that of upper source/drain regions 32 and lower capacitor electrodes 36 is shown, and which may be considered as part of one or both of an upper source/drain region 32 and a lower capacitor electrode 36. In one embodiment and as shown, lower capacitor electrodes 36 in individual groups 34 are arrayed in horizontally-elongated rows (e.g., rows 14) in a row direction (e.g., 24) that is orthogonal to a column direction (e.g., 28). In one such embodiment and as shown, lower capacitor electrodes 36 in individual groups 34 are arrayed in a 2D Bravais lattice, and in one such embodiment which is rectangular or square. The depicted portions of groups 34 are individually shown as comprising sixteen lower capacitor electrodes 36, although fewer or most-likely many more such lower capacitor electrodes would be within an individual group 34 both horizontally and vertically as depicted on the sheet of FIGS. 1 and 2. Regardless, and in one embodiment, groups 34 are individually horizontally elongated, for example as shown in column direction 28. FIGS. 1-4 only show two example groups 34 although most-likely many more than two such groups would be formed.

Figure 2:
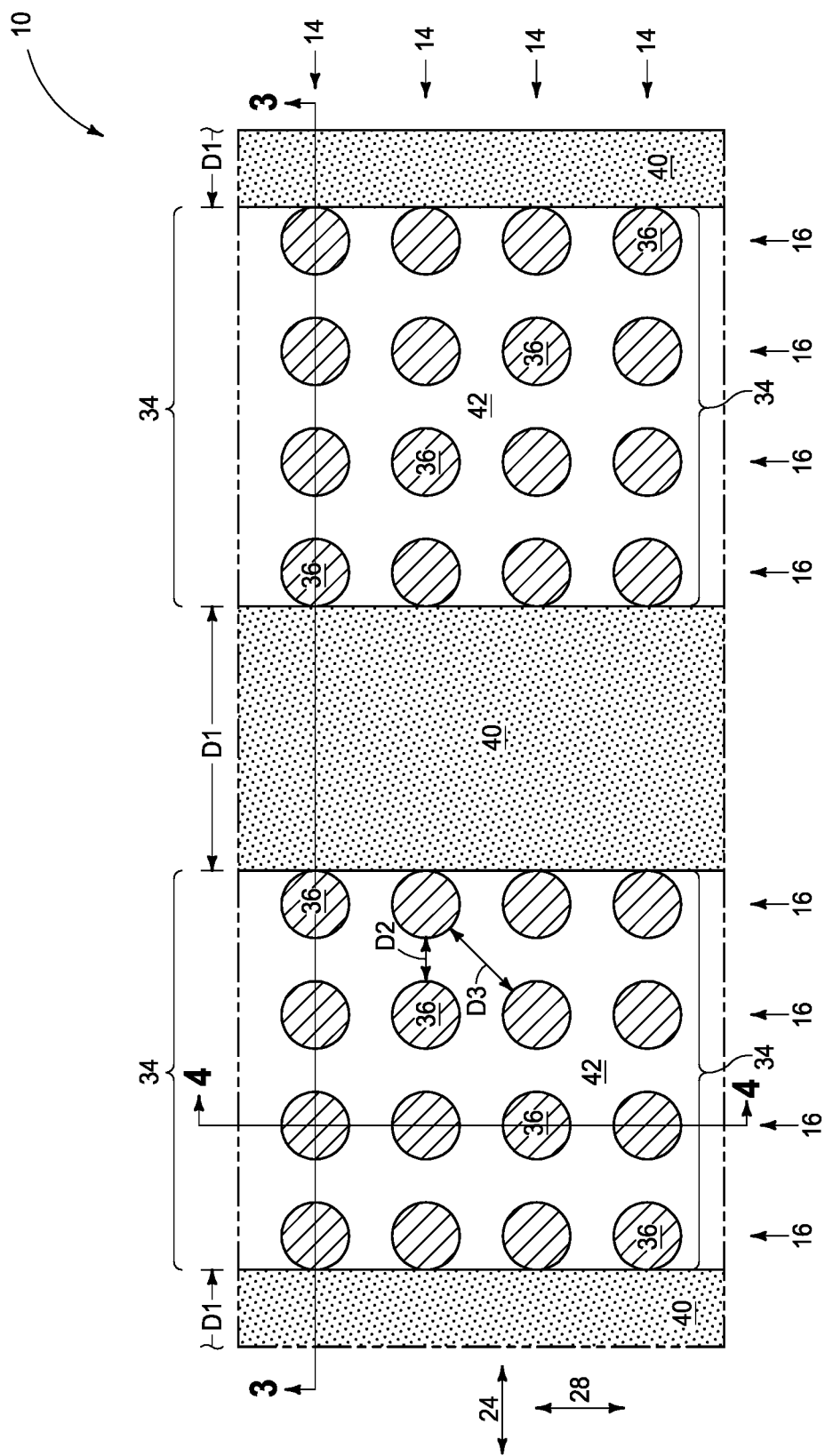
FIG. 2 is a view taken through line 2-2 in FIG. 3.

Adjacent groups 34 are horizontally spaced farther apart (e.g., dimension 131) than are adjacent lower capacitor electrodes 36 within groups 34 (e.g., compared to distances D2 and D3 in FIG. 2 considered individually). Material of lower capacitor electrodes 36 may comprise any existing or future-developed conductive material. In one embodiment and as shown, lower capacitor electrodes 36 are pillars, A material 40 (e.g., silicon dioxide or polysilicon), and in one embodiment which is entirely sacrificial, and a material 44 (e.g., silicon nitride) are shown received about lower capacitor electrodes 36, with example material 40 being within the gap between individual groups 34. Another material 42 (e.g., silicon nitride) is shown received about lower capacitor electrodes 36 within groups 34. Material 42 may serve as a bracing structure to facilitate maintaining lower capacitor electrodes 36 in an upright manner during fabrication of the array of capacitors and/or memory cells and is otherwise not material to the invention (as neither is material 44). One or more additional layers (not shown) of bracing material 42 may be provided between the tops and bottoms of lower capacitor electrodes 36 within individual groups 34.

Referring to FIGS. 5 and 6, openings 46 have been formed through material 42 to provide access to sacrificial material 40 there-below that is in groups 34. The relative diameters of lower capacitor electrodes 36, openings 46, and the spaces between the lower capacitor electrodes can be the same, greater, or lesser than each other. FIG. 6 and some other vertical section views are redacted below materials 38, 44, and 40 in comparison to FIGS. 3 and 4 for brevity.

FIGS. 7 and 8 show subsequent processing whereby sacrificial material 40 (not shown) has been removed (e.g., by isotropic wet etching selectively relative to lower capacitor electrodes 36 and materials 12, 42, and 44). Such has formed a void space 48 between adjacent groups 34 which in the depicted example embodiment is horizontally-elongated in column direction 28. In one embodiment, void space 48 has a minimum width (e.g., D1) in row direction 24 that is at least two times maximum pitch (e.g., P) of lower capacitor electrodes 36 in row direction 24. Void space 48 may be considered as comprising sidewalls 49 and a base 52.

Figure 9:
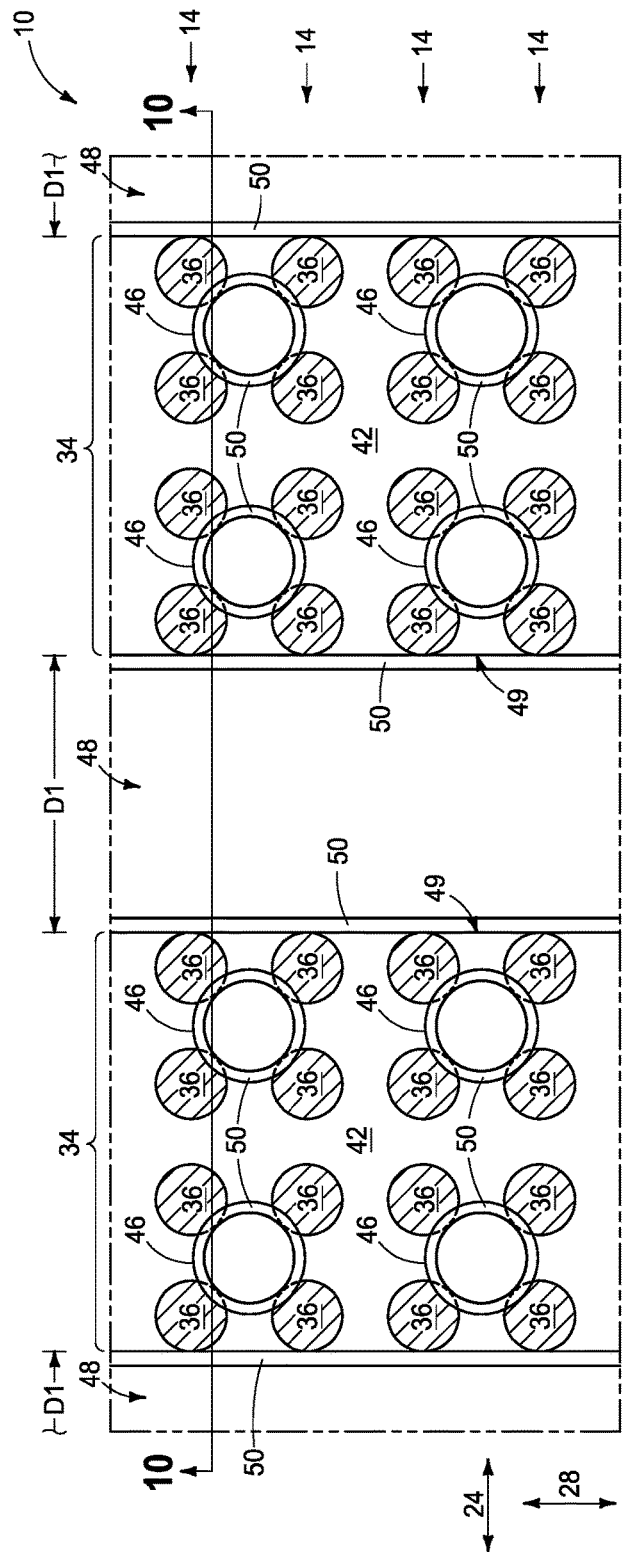
FIG. 9 is a view of the FIG. 7 construction at a processing step subsequent to that shown by FIG. 7 and is taken through line 9-9 in FIG. 10.
Figure 10:
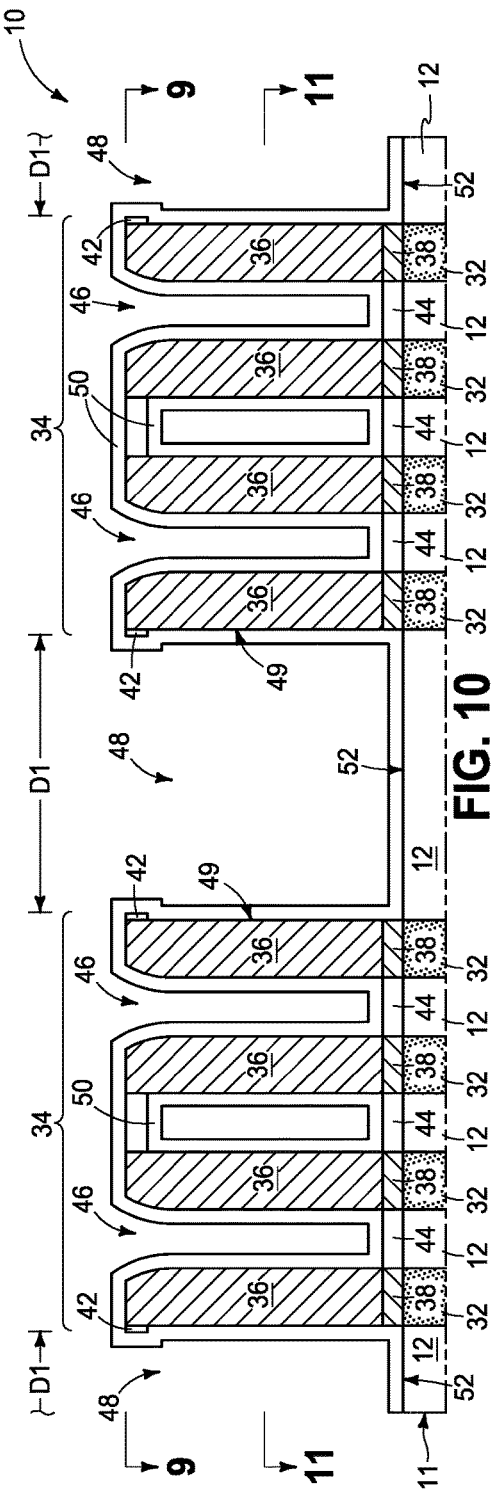
FIG. 10 is a view taken through line 10-10 in FIG. 9.
Figure 11:
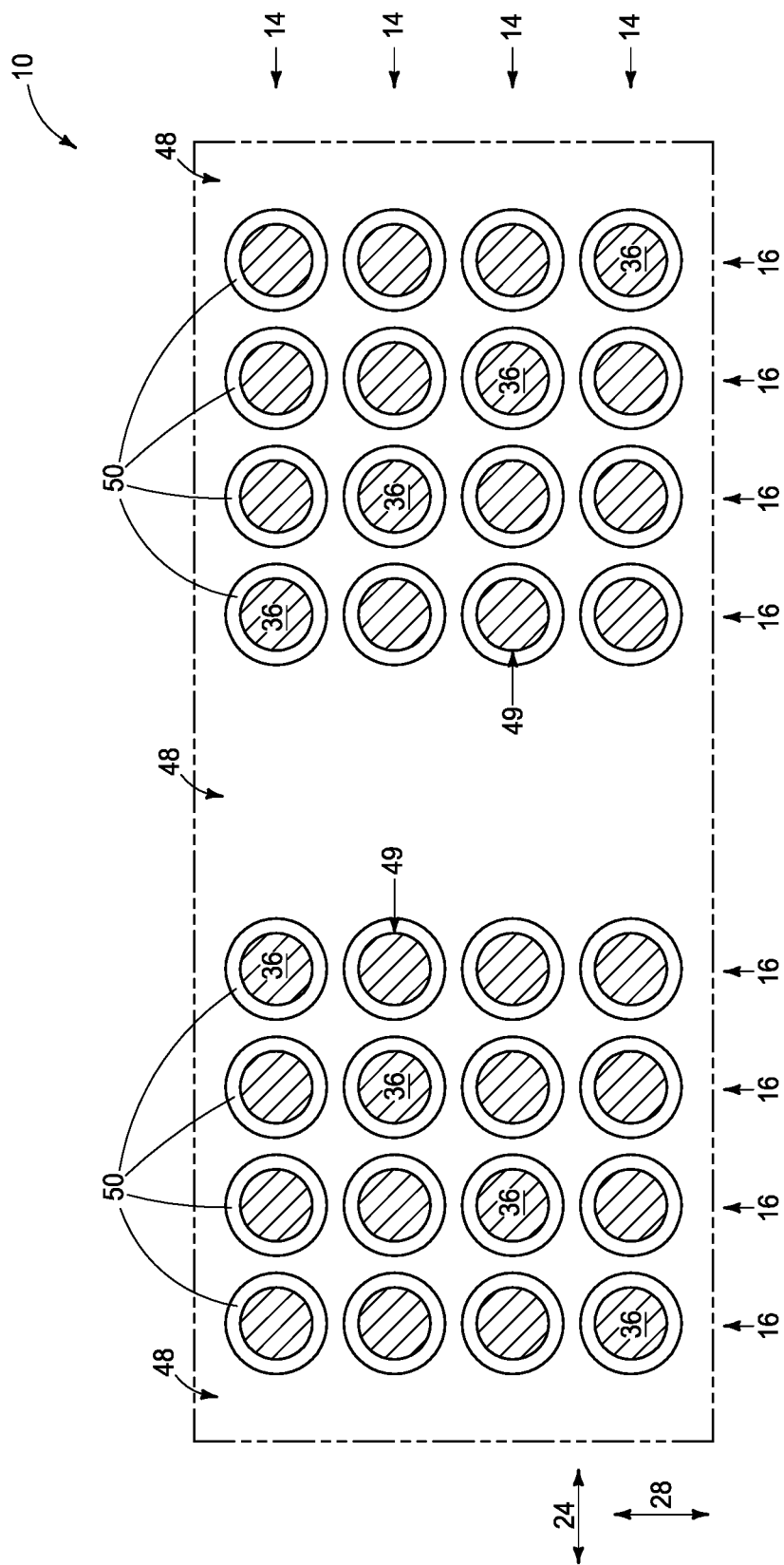
FIG. 11 is a view taken through line 11-11 in FIG. 10.
Figure 18:
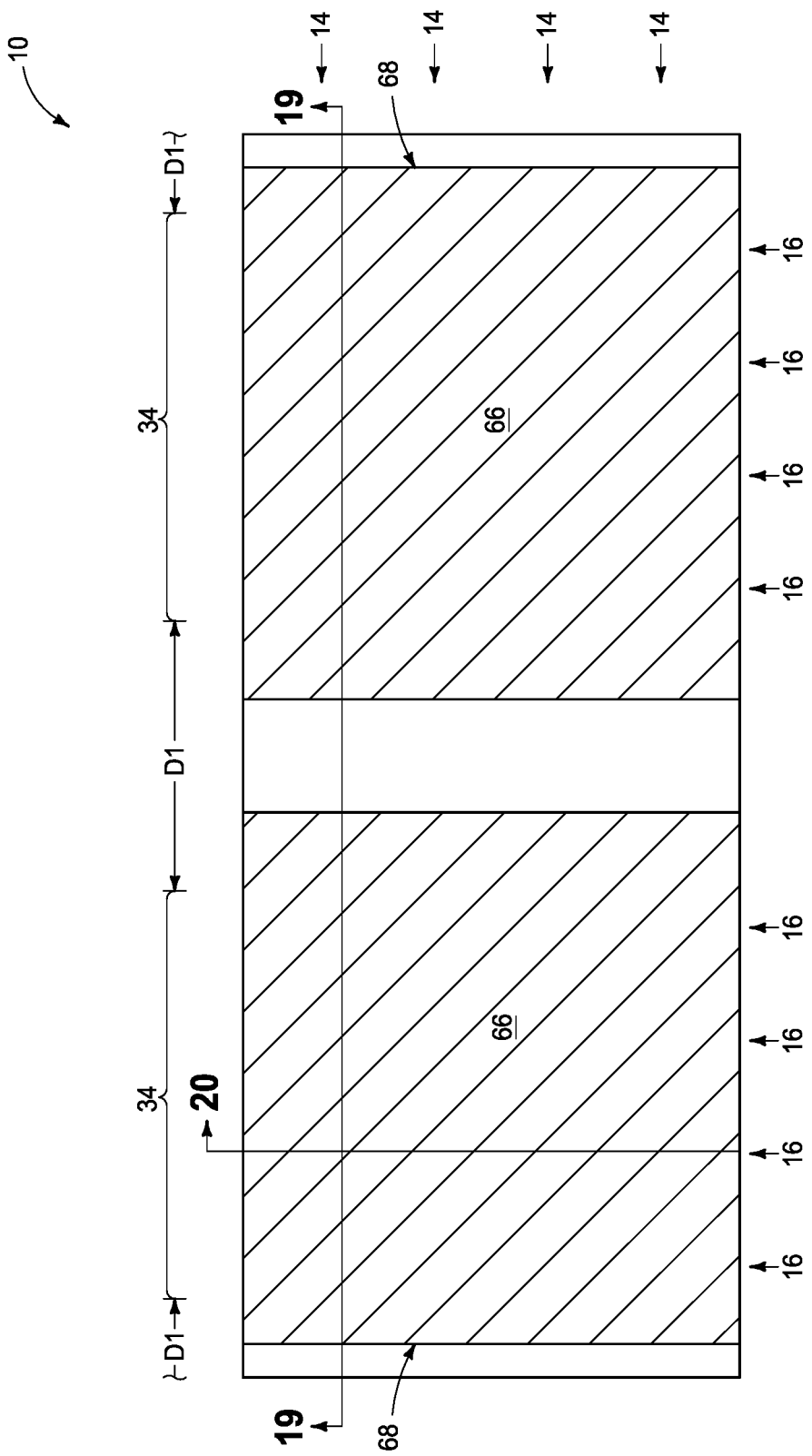
FIG. 18 is a view of the FIG. 16 construction at a processing step subsequent to that shown by FIG. 16 and is taken through line 18-18 in FIG. 19.
Figure 19:
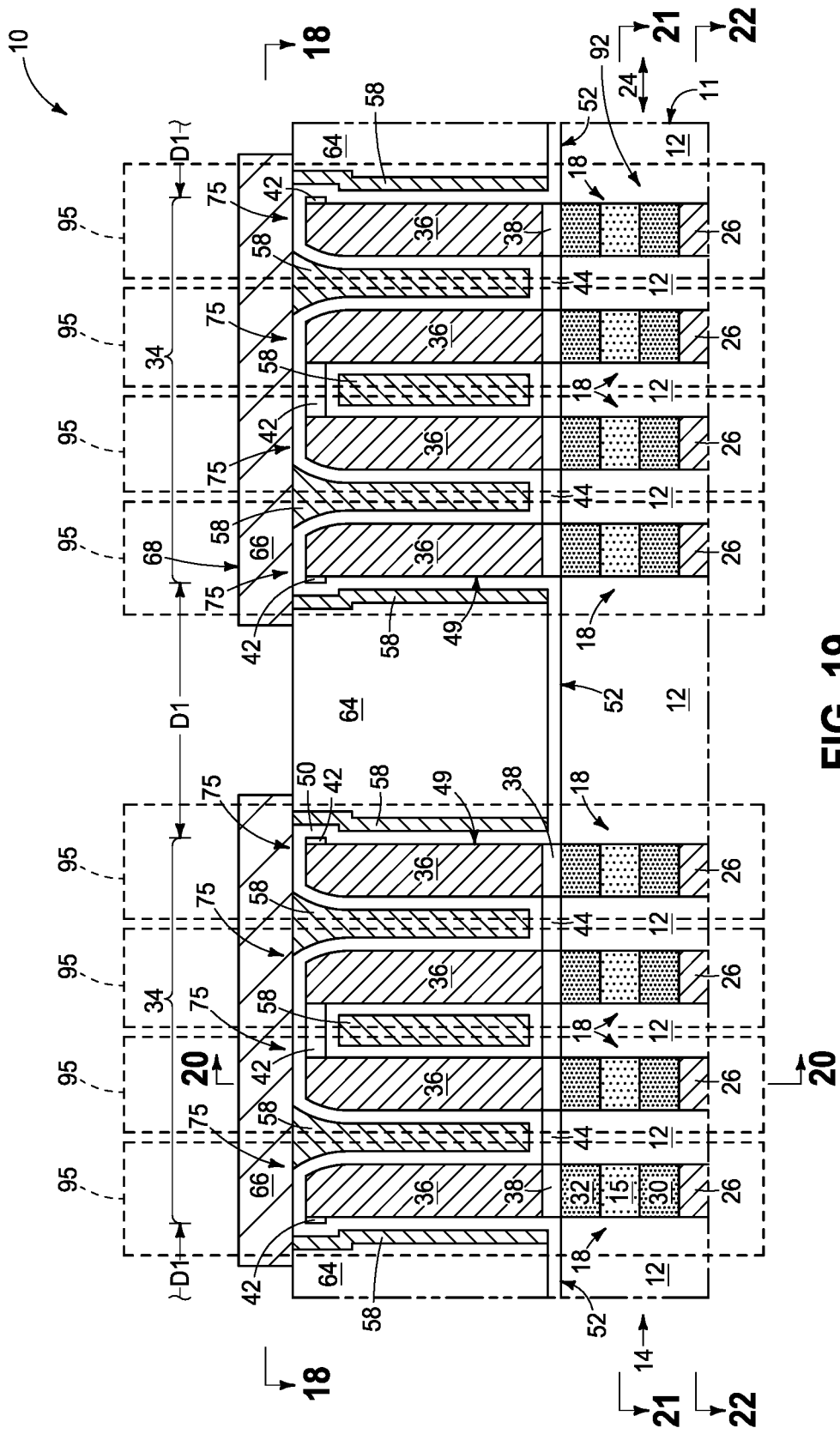
FIG. 19 is a view taken through line 19-19 in FIGS. 18, 21, and 22.
Figure 20:
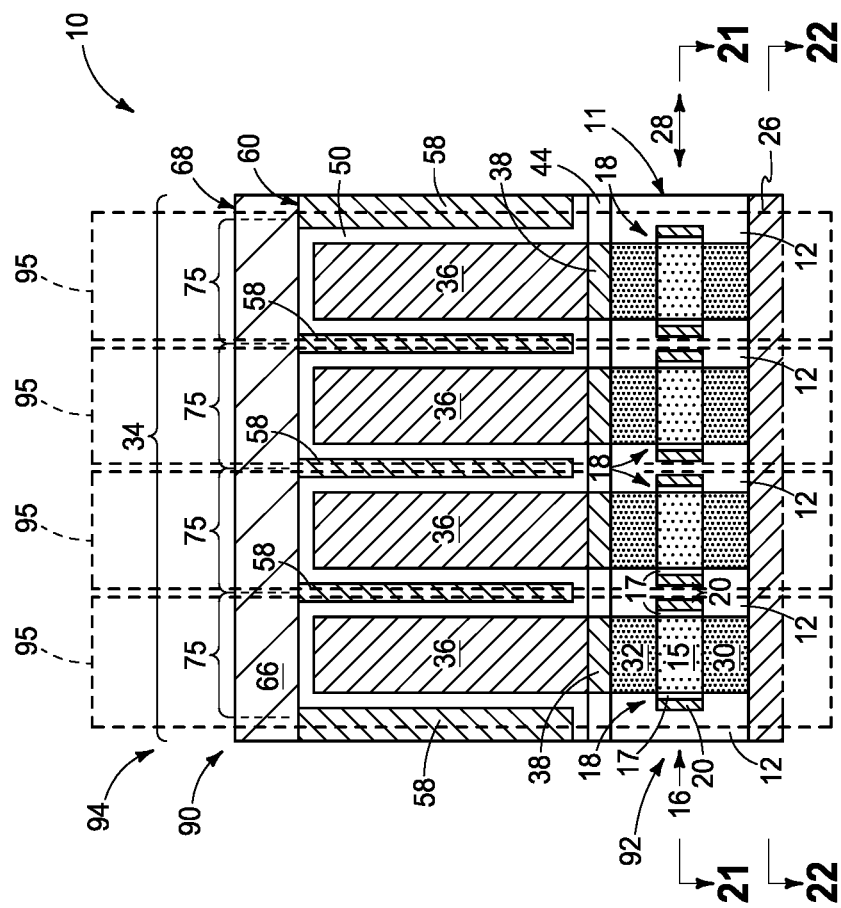
FIG. 20 is a view taken through line 20-20 in FIGS. 18, 19, and 22.
Figure 21:
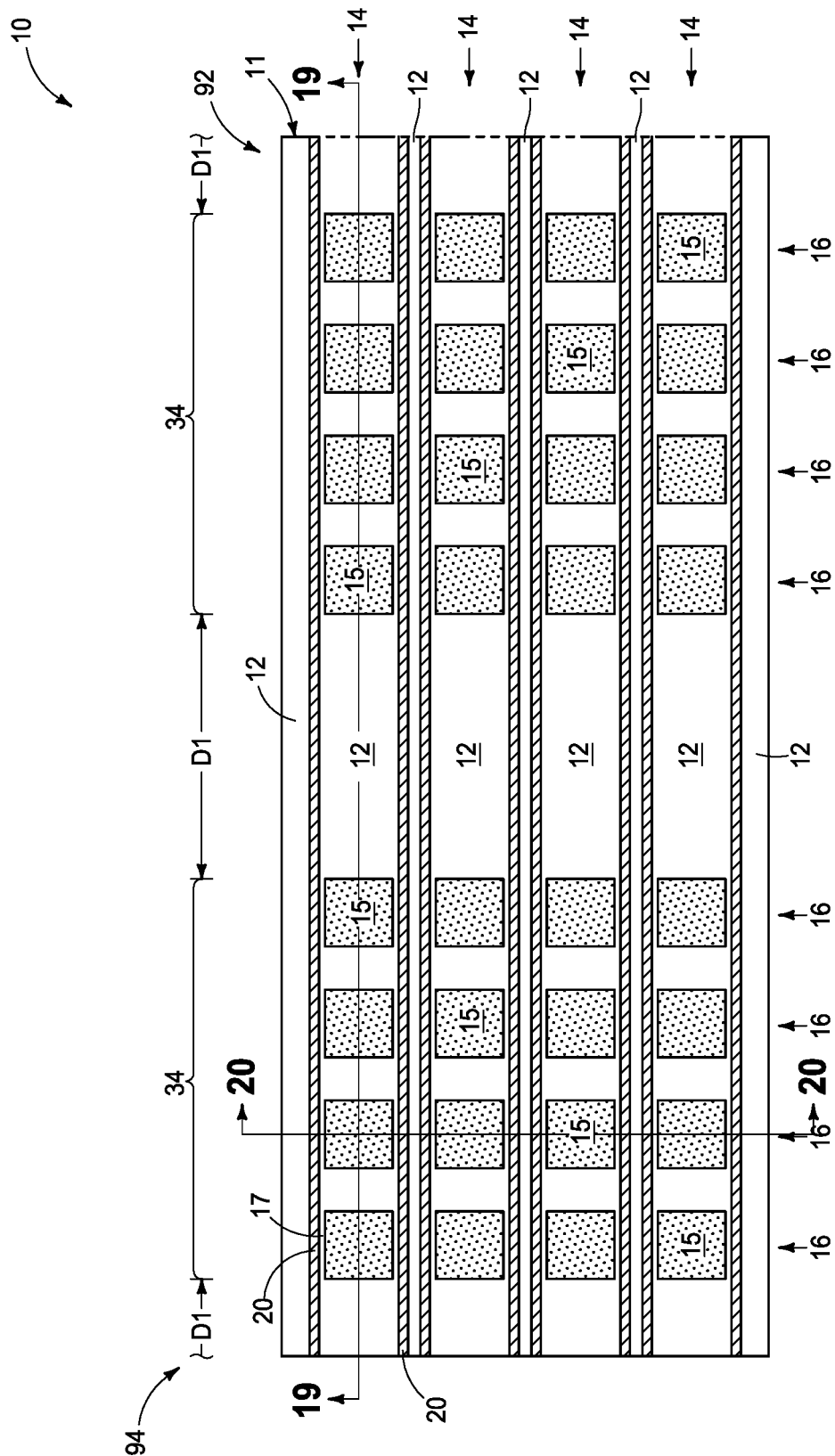
FIG. 21 is a view taken through line 21-21 in FIGS. 19 and 20.
Figure 22:
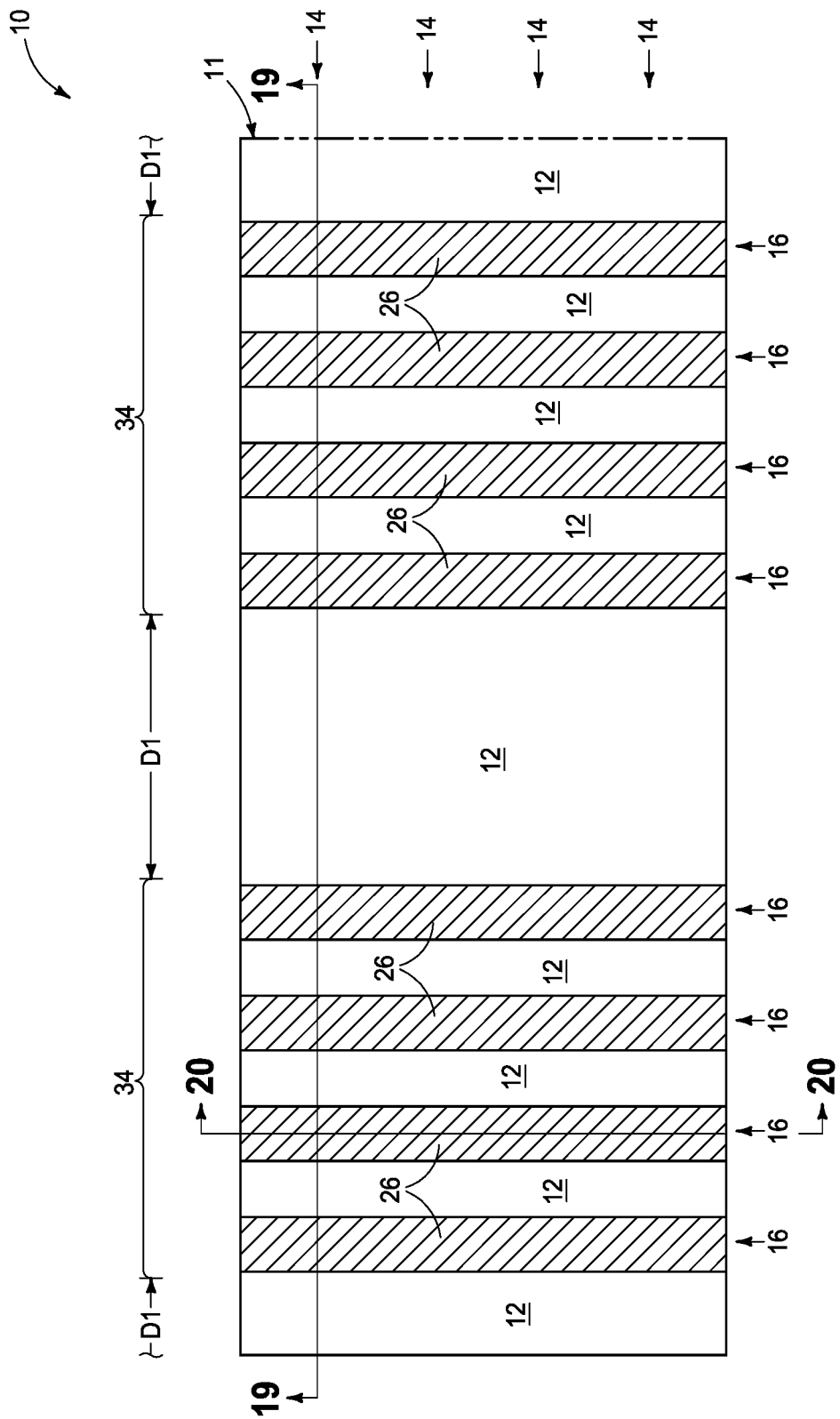
FIG. 22 is a view taken through line 22-22 in FIGS. 19 and 20.

Referring to FIGS. 9-11, a capacitor insulator 50 has been formed over lower capacitor electrodes 36. Such may comprise any existing or future-developed insulator material (e.g., silicon dioxide, silicon nitride, hafnium oxide, aluminum oxide, etc.) and in one embodiment capacitor insulator 50 is ferroelectric (e.g., any existing or future-developed ferroelectric material). In one embodiment and as shown, capacitor insulator 50 extends laterally across, and in one embodiment laterally all across, base 52 of void space 48, and in one embodiment capacitor insulator 50 has a thickness that is less than a horizontal thickness of individual lower capacitor electrodes 36.

Referring to FIGS. 12 and 13, upper capacitor electrode material 58 (e.g., TiN) has been formed in void space 48 and in groups 34 over capacitor insulator 50 and lower capacitor electrodes 36. Upper capacitor electrode material 58 in void space 48 connects the upper capacitor material 58 that is in adjacent groups 34 relative to one another, and less-than-fills void space 48. In one embodiment, upper capacitor electrode material 58 has a thickness that is no more than one-third of minimum horizontal width (e.g., D1) of void space 48, in one such embodiment that is no more than one-fourth of such minimum horizontal width, and in one such embodiment that is no more than one-fifth of such minimum horizontal width, Upper capacitor electrode material 58 may fill (not shown) all of the space between the lower capacitor electrodes 36 that are surrounded by capacitor insulator 50. In one embodiment and as shown, upper capacitor electrode material 58 is along sidewalk 49 of void space 48.

Referring to FIGS. 14 and 15, at least a portion of the upper capacitor electrode material 58 has been removed (e.g., by anisotropic etching) from void space 48 to disconnect upper capacitor electrode material 58 that is in adjacent groups 34 from being connected relative to one another. In one such embodiment, such removing occurs by anisotropic etching that is maskless over groups 34 and void space 48 (e.g., although masking material [not shown] may cover other portions of the construction not comprising such groups and void space). In one embodiment, the upper capacitor electrode material 58 is formed atop that portion (e.g., portion 70 in FIG. 13) of capacitor insulator 50 that extends laterally across base 52 of void space 48. In one such example embodiment, the maskless anisotropic etching removes upper capacitor electrode material 58 from being over a central part (e.g. central part 72 in FIGS. 13 and 15) of that portion 70 of capacitor insulator 50 that extends laterally across base 52 of void space 48. In one embodiment and as shown, upper capacitor electrode material 58 is formed along sidewalls 49 of void space 48, with the maskless anisotropic etching leaving that part of upper capacitor electrode material 58 that is along sidewalls 49 directly above remaining opposing non-central parts of portion 70 of the capacitor insulator that extends laterally across base 52 of void space 48. Regardless, and in one embodiment and as shown, the act of removing material 58 from void space 48 to disconnect it from being connected between adjacent groups 34 forms upper capacitor electrode material 58 as an upper capacitor electrode 60 that is common to all capacitors within individual groups 34. Example such capacitors 75 within groups 34 individually comprise one of lower capacitor electrodes 36, capacitor insulator 50, and common upper capacitor electrode 60 in the respective individual group 34 (e.g., sixteen example capacitors 75 being shown within individual groups 34). In one example embodiment and as shown, an array 90 of capacitors 75 has been formed.

Referring to FIGS. 16 and 17 and in one embodiment, remaining volume of void space 48 has been filled with insulating material 64 (e.g., silicon nitride and/or silicon dioxide). In one such embodiment, such may be conducted by initially over-filling the remaining volume of void space 48 with insulating material 64 followed by planarizing such back at least to an elevationally-outermost surface of capacitor insulator 50, Referring to FIGS. 18-22, a horizontally-elongated conductive line 68 (e.g., comprising conductive material 66) has been formed atop and directly electrically coupled to upper capacitor electrode material 58 in individual groups 34. In one embodiment and as shown, horizontally-elongated conductive line 68 is formed directly against capacitor insulator 50 and directly against upper capacitor electrode material 58 in individual groups 34 as shown. In one embodiment and as shown, a part of horizontally-elongated conductive line 68 is formed directly above, and in one embodiment directly against, insulating material 64.

Any other attribute(s) or aspect(s) as shown and/or described herein with respect to other embodiments may be used with respect to the above-described embodiments.

An embodiment of the invention comprises a method of forming an array (e.g., 90) of capacitors (e.g., 75) independent of whether such comprise part of a memory array and independent of whether such are formed relative to transistors that have been formed previously there-below. Such an embodiment comprises forming a plurality of horizontally-spaced groups (e.g., 34) individually comprising a plurality of horizontally-spaced lower capacitor electrodes (e.g., 36) having a capacitor insulator (e,g., 50) thereover. Adjacent of the groups are horizontally spaced farther apart (e.g., D1) than are adjacent of the lower capacitor electrodes within the groups (e.g., D2 and D3 considered individually). A void space (e.g., 48) is between the adjacent groups. Upper capacitor electrode material (e.g., 58) is formed in the void space and in the groups over the capacitor insulator and the lower capacitor electrodes. The upper capacitor electrode material in the void space connects the upper capacitor electrode material that is in the adjacent groups relative to one another. The upper capacitor electrode material less-than-fills the void space. At least a portion of the upper capacitor electrode material is removed from the void space to disconnect the upper capacitor electrode material in the adjacent groups from being connected relative to one another (e.g., is at least partially removed from connecting in the void space). A horizontally-elongated conductive line (e.g., 68) is formed atop and directly electrically coupled to the upper capacitor electrode material in individual of the groups. In one embodiment, a plurality of transistors (e.g., 18) is formed, with the transistors individually being directly electrically coupled to individual of the lower capacitor electrodes, and in one such embodiment those transistors are vertical transistors. Any other attribute(s) or aspect(s) as shown and/or described herein with respect to other embodiments may be used.

At least some method embodiments of the invention may facilitate easier removal of upper capacitor electrode material 58 than if such filled void space 48.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

An embodiment of the invention comprises an array (e.g., 90) of capacitors (e.g., 75) independent of method of manufacture. Such an array comprises a plurality of horizontally-spaced groups (e.g., 34) individually comprising a plurality of horizontally-spaced lower capacitor electrodes (e.g., 36). Adjacent of the groups are horizontally spaced farther apart (e.g., D1) than are adjacent of the lower capacitor electrodes within the groups (e.g., 172 and 173 considered individually). A capacitor insulator (e.g., 50) is over the lower capacitor electrodes. An upper capacitor electrode (e.g., 60) is common to all capacitors in individual of the groups. The capacitors in the individual groups individually comprise one of the lower capacitor electrodes, the capacitor insulator, and the common upper capacitor electrode in the respective individual group. A horizontally-elongated conductive line (e.g., 68) is atop and directly electrically coupled to the upper capacitor electrode in the individual group. In one embodiment, the array further comprises an array (e.g., 92 in FIGS. 19-21) of transistors (e.g., 18) below the array of capacitors, with the transistors individually being directly electrically coupled to individual of the lower capacitor electrodes. In one embodiment, the invention comprises an array (e.g., 94) of memory cells (e.g., 95, and there would be sixteen of those in the depicted embodiment that shows sixteen capacitors) individually comprising one of the capacitors and one of the transistors. Any other attribute(s) or aspect(s) as shown and/or described herein with respect to other embodiments may be used.

An embodiment of the invention encompasses an array (e.g., 94) of ferroelectric memory cells (e.g., 95) individually comprising a ferroelectric capacitor (e.g., 75) above a transistor (e.g., 18). Such an array comprises rows (e,g., 14) and columns (e.g., 16) of vertical transistors (e.g., 18). An access line (e.g., 20) interconnects multiple of the transistors along individual of the rows in a row direction (e.g., 24) a digitline (e.g., 26) interconnects multiple of the transistors along individual of the columns in a column direction (e.g., 28). The transistors individually comprise a lower source/drain region (e.g., 30) directly electrically coupled with individual of the digitlines. The transistors individually comprise an upper source/drain region (e.g., 32). A plurality of horizontally-spaced groups (e.g., 34) individually comprise a plurality of horizontally-spaced lower capacitor electrodes (e.g., 36). Individual of the lower capacitor electrodes are directly above and directly electrically coupled to individual of the upper source/drain regions. Adjacent of the groups are horizontally spaced apart from one another by a gap (e.g., across D1) that is greater than horizontal spacing between adjacent of the lower capacitor electrodes within the group (e.g., D2 and D3 considered individually), The gap is horizontally elongated in the column direction. A ferroelectric capacitor insulator (e.g., 50) is over the lower capacitor electrodes. An upper capacitor electrode (e.g., 60) is common to all capacitors in individual of the groups. The capacitors (e.g., 75) in the individual groups individually comprise one of the lower capacitor electrodes, the capacitor insulator, and the common upper capacitor electrode in the respective individual group. A horizontally-elongated conductive line (e.g., 68) is atop and directly electrically coupled to the upper capacitor electrode in the individual groups. Any other attribute(s) or aspect(s) as shown and/or described herein with respect to other embodiments may be used.

The above processing or construction may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

CONCLUSION

In some embodiments, a method of forming an array of capacitors comprises forming a plurality of horizontally-spaced groups that individually comprise a plurality of horizontally-spaced lower capacitor electrodes having a capacitor insulator thereover. Adjacent of the groups are horizontally spaced farther apart than are adjacent of the lower capacitor electrodes within the groups. A void space is between the adjacent groups. An upper capacitor electrode material is formed in the void space and in the groups over the capacitor insulator and the lower capacitor electrodes. The upper capacitor electrode material in the void space connects the upper capacitor electrode material that is in the adjacent groups relative to one another. The upper capacitor electrode material less-than-fills the void space. At least a portion of the upper capacitor electrode material is removed from the void space to disconnect the upper capacitor electrode material in the adjacent groups from being connected relative to one another. A horizontally-elongated conductive line is formed atop and is directly electrically coupled to the upper capacitor electrode material in individual of the groups.

IN some embodiments, a method of forming an array of ferroelectric memory cells individually comprising a ferroelectric capacitor above a transistor comprises forming rows and columns of vertical transistors relative to a substrate. An access line interconnects multiple of the transistors along individual of the rows in a row direction. A digitline interconnects multiple of the transistors along individual of the columns in a column direction. The transistors individually comprise a lower source/drain region directly electrically coupled to individual of the digitlines. The transistors individually comprise an upper source/drain region. A plurality of horizontally-spaced groups are formed that individually comprise a plurality of horizontally-spaced lower capacitor electrodes which have a ferroelectric capacitor insulator thereover. Individual of the lower capacitor electrodes are directly above and directly electrically coupled to individual of the upper source/drain regions. Adjacent of the groups are horizontally spaced farther apart than are adjacent of the lower capacitor electrodes within the groups. A void space is horizontally-elongated in the column direction and is between the adjacent groups. Upper capacitor electrode material is formed in the void space and in the groups over the capacitor insulator and the lower capacitor electrodes. The upper capacitor electrode material in the void space connects the upper capacitor electrode material in the adjacent groups relative to one another. The upper capacitor electrode material less-than-fills the void space. At least a portion of the upper capacitor electrode material is removed from the void space to disconnect the upper capacitor electrode material in the adjacent groups from being connected relative to one another. A horizontally-elongated conductive line is formed atop and directly electrically coupled to the upper capacitor electrode material in individual of the groups.

In some embodiments, an array of capacitors comprises a plurality of horizontally-spaced groups which individually comprise a plurality of horizontally-spaced lower capacitor electrodes. Adjacent of the groups are horizontally spaced farther apart than are adjacent of the lower capacitor electrodes within the groups. A capacitor insulator is over the lower capacitor electrodes. An upper capacitor electrode is common to all capacitors in individual of the groups. The capacitors in the individual groups individually comprise one of the lower capacitor electrodes, the capacitor insulator, and the common upper capacitor electrode in the respective individual group. A horizontally-elongated conductive line is atop and directly electrically coupled to the upper capacitor electrode in the individual groups.

In some embodiments, an array of ferroelectric memory cells individually comprises a ferroelectric capacitor above a transistor. The array comprises rows and columns of vertical transistors. An access line interconnects multiple of the transistors along individual of the rows in a row direction. A digitline interconnects multiple of the transistors along individual of the columns in a column direction. The transistors individually comprise a lower source/drain region that is directly electrically coupled to individual of the digitlines. The transistors individually comprise an upper source/drain region. A plurality of horizontally-spaced groups individually comprise a plurality of horizontally-spaced lower capacitor electrodes. Individual of the lower capacitor electrodes are directly above and directly electrically coupled to individual of the upper source/drain regions. Adjacent of the groups are horizontally spaced apart from one another by a gap that is greater than the horizontal spacing between adjacent of the lower capacitor electrodes within the groups. The gap is horizontally elongated in the column direction. A ferroelectric capacitor insulator is over the lower capacitor electrodes. An upper capacitor electrode is common to all capacitors in individual of the groups. The capacitors in the individual groups individually comprise one of the lower capacitor electrodes, the capacitor insulator, and the common upper capacitor electrode in the respective individual group. A horizontally-elongated conductive line is atop and directly electrically coupled to the upper capacitor electrode in the individual groups.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of capacitors comprising:
a plurality of horizontally-spaced groups individually comprising horizontally-spaced lower capacitor electrodes, individual of the groups comprising rows and columns of the horizontally-spaced lower capacitor electrodes, the rows and the columns each comprising a plurality of the horizontally-spaced lower capacitor electrodes, adjacent of the groups being horizontally spaced farther apart than are adjacent of the lower capacitor electrodes within the groups;
a capacitor insulator over the lower capacitor electrodes;
an upper capacitor electrode that is common to all capacitors in the individual groups; the capacitors in the individual groups individually comprising one of the lower capacitor electrodes, the capacitor insulator, and the common upper capacitor electrode in the respective individual group; and
a horizontally-elongated conductive line atop and directly electrically coupled to the upper capacitor electrode in the individual groups, the horizontally-elongated conductive line horizontally spanning across multiple of the rows and multiple of the columns.

2. The array of capacitors of claim 1 further comprising an array of transistors below the array of capacitors, the transistors individually being directly electrically coupled to individual of the lower capacitor electrodes.

3. The array of capacitors of claim 2 wherein the transistors are vertical transistors.

4. The array of capacitors of claim 2 comprising an array of memory cells individually comprising one of the capacitors and one of the transistors.

5. The array of capacitors of claim 1 comprising a plurality of horizontally-spaced bracing structures, adjacent of the bracing structures being horizontally spaced farther apart than are adjacent of the lower capacitor electrodes within the groups.

6. The array of capacitors of claim 5 comprising a plurality of openings formed through individual of the bracing structures.

7. The array of capacitors of claim 6 wherein the capacitor insulator extends through individual of the openings.

8. The array of capacitors of claim 6 wherein the common upper capacitor electrode extends through individual of the openings.

9. The array of capacitors of claim 6 wherein the capacitor insulator and the common upper capacitor electrode extend through individual of the openings.

10. The array of capacitors of claim 6 wherein individual of the openings are circumferentially surrounded by multiple of the lower capacitor electrodes.

11. The array of capacitors of claim 10 wherein the multiple is four per the individual openings.

12. The array of capacitors of claim 11 wherein the four are equally circumferentially spaced relative one another circumferentially around the individual openings.

13. The array of capacitors of claim 1 comprising a plurality of horizontally-spaced bracing structures, the horizontally-elongated conductive lines individually having opposing lateral edges in a vertical cross-section that are laterally outward of opposing lateral edges of individual of the bracing structures in the vertical cross-section.

14. The array of capacitors of claim 1 comprising a plurality of horizontally-spaced bracing structures, the horizontally-elongated conductive lines individually having opposing lateral edges in a vertical cross-section that are laterally outward of opposing lateral edges of the common upper capacitor electrode in the respective individual group.

15. The array of capacitors of claim 1 comprising:
a plurality of horizontally-spaced bracing structures, the horizontally-elongated conductive lines individually having opposing lateral edges in a vertical cross-section that are laterally outward of opposing lateral edges of individual of the bracing structures in the vertical cross-section; and
the opposing lateral edges the horizontally-elongated conductive lines in the vertical cross-section being laterally outward of opposing lateral edges of the common upper capacitor electrode in the respective individual group.

16. An array of ferroelectric memory cells individually comprising a ferroelectric capacitor above a transistor, comprising:
- rows and columns of vertical transistors, an access line interconnecting multiple of the transistors along individual of the rows of the vertical transistors in a row direction, a digitline interconnecting multiple of the transistors along individual of the columns of the vertical transistors in a column direction, the transistors individually comprising a lower source/drain region directly electrically coupled with individual of the digitlines, the transistors individually comprising an upper source/drain region;
- a plurality of horizontally-spaced groups individually comprising horizontally-spaced lower capacitor electrodes, individual of the lower capacitor electrodes being directly above and directly electrically coupled to individual of the upper source/drain regions, individual of the groups comprising lower-capacitor-electrode rows and lower-capacitor-electrode columns of the horizontally-spaced lower capacitor electrodes, the lower-capacitor-electrode rows and the lower-capacitor-electrode columns each comprising a plurality of the horizontally-spaced lower capacitor electrodes, adjacent of the groups being horizontally spaced apart from one another by a gap that is greater than horizontal spacing between adjacent of the lower capacitor electrodes within the groups, the gap being horizontally elongated in the column direction;
- a ferroelectric capacitor insulator over the lower capacitor electrodes;
- an upper capacitor electrode that is common to all capacitors in the individual groups; the capacitors in the individual groups individually comprising one of the lower capacitor electrodes, the capacitor insulator, and the common upper capacitor electrode in the respective individual group; and
- a horizontally-elongated conductive line atop and directly electrically coupled to the upper capacitor electrode in the individual groups, the horizontally-elongated conductive line horizontally spanning across multiple of the lower-capacitor-electrode rows and multiple of the lower-capacitor-electrode columns.

17. The array of capacitors of claim 16 comprising a plurality of horizontally-spaced bracing structures, the horizontally-elongated conductive lines individually having opposing lateral edges in a vertical cross-section that are laterally outward of opposing lateral edges of individual of the bracing structures in the vertical cross-section.

18. The array of capacitors of claim 16 comprising a plurality of horizontally-spaced bracing structures, the horizontally-elongated conductive lines individually having opposing lateral edges in a vertical cross-section that are laterally outward of opposing lateral edges of the common upper capacitor electrode in the respective individual group.

19. The array of capacitors of claim 16 comprising:
- a plurality of horizontally-spaced bracing structures, the horizontally-elongated conductive lines individually having opposing lateral edges in a vertical cross-section that are laterally outward of opposing lateral edges of individual of the bracing structures in the vertical cross-section; and
- the opposing lateral edges the horizontally-elongated conductive lines in the vertical cross-section being laterally outward of opposing lateral edges of the common upper capacitor electrode in the respective individual group.

20. The array of capacitors of claim 16 comprising:
- a plurality of horizontally-spaced bracing structures, adjacent of the bracing structures being horizontally spaced farther apart than are adjacent of the lower capacitor electrodes within the groups;
- a plurality of openings formed through individual of the bracing structures;
- the capacitor insulator and the common upper capacitor electrode extending through individual of the openings; and
- individual of the openings being are circumferentially surrounded by multiple of the lower capacitor electrodes that are equally circumferentially spaced relative one another circumferentially around the individual openings.

* * * * *